(12) United States Patent
Wang et al.

(10) Patent No.: US 8,743,561 B2
(45) Date of Patent: Jun. 3, 2014

(54) WAFER-LEVEL MOLDED STRUCTURE FOR PACKAGE ASSEMBLY

(75) Inventors: Tsung-Ding Wang, Tainan (TW); Bo-I Lee, Sindian (TW); Chien-Hsiun Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 364 days.

(21) Appl. No.: 12/813,979

(22) Filed: Jun. 11, 2010

(65) Prior Publication Data

US 2011/0051378 A1 Mar. 3, 2011

Related U.S. Application Data

(60) Provisional application No. 61/237,153, filed on Aug. 26, 2009.

(51) Int. Cl.
 *H05K 1/00* (2006.01)
(52) U.S. Cl.
 USPC ........... 361/784; 257/659; 257/668; 257/678; 257/737; 257/777; 438/106; 438/108
(58) Field of Classification Search
 USPC .......... 361/748, 784; 257/659, 668, 678, 737, 257/777; 438/106, 108
 See application file for complete search history.

(56) References Cited

U.S. PATENT DOCUMENTS

| | | | | |
|---|---|---|---|---|
| 4,681,712 A | * | 7/1987 | Sakakibara et al. | 264/440 |
| 5,350,558 A | * | 9/1994 | Kawato et al. | 419/35 |
| 5,990,247 A | * | 11/1999 | Terada et al. | 525/415 |
| 6,124,393 A | * | 9/2000 | Haraguchi et al. | 524/492 |
| 6,139,956 A | * | 10/2000 | Endoh et al. | 428/378 |
| 6,333,564 B1 | * | 12/2001 | Katoh et al. | 257/780 |
| 6,339,254 B1 | * | 1/2002 | Venkateshwaran et al. | 257/686 |
| 6,344,401 B1 | * | 2/2002 | Lam | 438/460 |
| 6,384,128 B1 | * | 5/2002 | Wadahara et al. | 524/496 |
| 6,528,348 B2 | * | 3/2003 | Ando et al. | 438/109 |
| 6,633,078 B2 | * | 10/2003 | Hamaguchi et al. | 257/686 |
| 6,847,105 B2 | * | 1/2005 | Koopmans | 257/686 |
| 6,894,381 B2 | * | 5/2005 | Hetzel et al. | 257/686 |
| 7,129,584 B2 | * | 10/2006 | Lee | 257/778 |
| 7,189,593 B2 | * | 3/2007 | Lee | 438/107 |
| 7,288,841 B2 | * | 10/2007 | Yamano | 257/723 |
| 7,402,442 B2 | * | 7/2008 | Condorelli et al. | 438/5 |
| 7,750,449 B2 | * | 7/2010 | Schwab et al. | 257/678 |
| 7,768,005 B2 | * | 8/2010 | Condorelli et al. | 257/48 |
| 7,791,192 B1 | * | 9/2010 | Joshi et al. | 257/724 |
| 7,859,098 B2 | * | 12/2010 | Ong et al. | 257/698 |
| 7,964,446 B2 | * | 6/2011 | Onodera et al. | 438/108 |

(Continued)

FOREIGN PATENT DOCUMENTS

| | | |
|---|---|---|
| JP | 2002-016212 | 1/2002 |
| JP | 2005-259819 | 9/2005 |

(Continued)

*Primary Examiner* — Xiaoliang Chen
(74) *Attorney, Agent, or Firm* — Slater and Matsil, L.L.P.

(57) ABSTRACT

An integrated circuit structure includes a bottom die; a top die bonded to the bottom die with the top die having a size smaller than the bottom die; and a molding compound over the bottom die and the top die. The molding compound contacts edges of the top die. The edges of the bottom die are vertically aligned to respective edges of the molding compound.

8 Claims, 9 Drawing Sheets

(56) References Cited

U.S. PATENT DOCUMENTS

| | | | |
|---|---|---|---|
| 8,253,230 B2* | 8/2012 | Janzen et al. | 257/686 |
| 8,390,117 B2* | 3/2013 | Shimizu et al. | 257/738 |
| 8,410,596 B2* | 4/2013 | Karnezos | 257/686 |
| 8,415,783 B1* | 4/2013 | Rahman et al. | 257/686 |
| 8,441,116 B2* | 5/2013 | Lee et al. | 257/690 |
| 2002/0155252 A1* | 10/2002 | Tsuji et al. | 428/116 |
| 2003/0134450 A1* | 7/2003 | Lee | 438/106 |
| 2003/0141583 A1* | 7/2003 | Yang | 257/686 |
| 2003/0170444 A1* | 9/2003 | Stewart et al. | 428/317.7 |
| 2003/0170450 A1* | 9/2003 | Stewart et al. | 428/343 |
| 2003/0203537 A1* | 10/2003 | Koopmans | 438/109 |
| 2003/0230801 A1* | 12/2003 | Jiang et al. | 257/723 |
| 2004/0012081 A1* | 1/2004 | Kwon | 257/686 |
| 2004/0051119 A1* | 3/2004 | Kikuma et al. | 257/200 |
| 2004/0063247 A1* | 4/2004 | Emoto | 438/108 |
| 2004/0113256 A1* | 6/2004 | Thomas et al. | 257/686 |
| 2004/0124539 A1* | 7/2004 | Yang et al. | 257/777 |
| 2004/0159954 A1* | 8/2004 | Hetzel et al. | 257/777 |
| 2004/0164385 A1* | 8/2004 | Kado et al. | 257/678 |
| 2004/0219713 A1* | 11/2004 | Lee | 438/106 |
| 2005/0106834 A1* | 5/2005 | Andry et al. | 438/424 |
| 2005/0167798 A1* | 8/2005 | Doan | 257/678 |
| 2005/0208701 A1* | 9/2005 | Jeong et al. | 438/106 |
| 2005/0218518 A1* | 10/2005 | Jiang et al. | 257/738 |
| 2006/0001140 A1* | 1/2006 | Lee et al. | 257/686 |
| 2006/0006517 A1* | 1/2006 | Lee et al. | 257/686 |
| 2006/0027841 A1* | 2/2006 | Tamaki | 257/286 |
| 2006/0134833 A1* | 6/2006 | Baek et al. | 438/108 |
| 2006/0138649 A1* | 6/2006 | Karnezos | 257/723 |
| 2006/0141668 A1* | 6/2006 | Karnezos | 438/106 |
| 2006/0170087 A1* | 8/2006 | Nakajima | 257/678 |
| 2006/0170091 A1* | 8/2006 | Karnezos | 257/686 |
| 2006/0172461 A1* | 8/2006 | Karnezos | 438/109 |
| 2006/0172462 A1* | 8/2006 | Karnezos | 438/109 |
| 2006/0172463 A1* | 8/2006 | Karnezos | 438/109 |
| 2006/0192292 A1* | 8/2006 | Wang et al. | 257/777 |
| 2006/0214153 A1* | 9/2006 | Ikezawa et al. | 257/40 |
| 2006/0220209 A1* | 10/2006 | Karnezos et al. | 257/686 |
| 2006/0244117 A1* | 11/2006 | Karnezos et al. | 257/678 |
| 2006/0249851 A1* | 11/2006 | Karnezos | 257/777 |
| 2006/0284298 A1* | 12/2006 | Kim et al. | 257/686 |
| 2007/0045803 A1* | 3/2007 | Ye et al. | 257/686 |
| 2007/0152313 A1* | 7/2007 | Periaman et al. | 257/686 |
| 2007/0158810 A1* | 7/2007 | Song et al. | 257/686 |
| 2007/0170571 A1* | 7/2007 | Gerber et al. | 257/686 |
| 2007/0228542 A1* | 10/2007 | Hussa | 257/686 |
| 2007/0235850 A1* | 10/2007 | Gerber et al. | 257/678 |
| 2008/0074852 A1* | 3/2008 | Lee | 361/749 |
| 2008/0105965 A1* | 5/2008 | Song et al. | 257/686 |
| 2008/0203581 A1* | 8/2008 | Thomas et al. | 257/777 |
| 2008/0246126 A1* | 10/2008 | Bowles et al. | 257/659 |
| 2008/0251938 A1* | 10/2008 | Wang et al. | 257/777 |
| 2008/0251939 A1* | 10/2008 | Chung et al. | 257/777 |
| 2009/0032971 A1* | 2/2009 | Chan et al. | 257/777 |
| 2009/0200652 A1* | 8/2009 | Oh et al. | 257/686 |
| 2009/0215953 A1* | 8/2009 | Hwang et al. | 524/496 |
| 2009/0286929 A1* | 11/2009 | Oshimi et al. | 524/611 |
| 2010/0102446 A1* | 4/2010 | Katsurayama et al. | 257/738 |
| 2010/0117226 A1* | 5/2010 | Yang et al. | 257/737 |
| 2010/0120206 A1* | 5/2010 | Chua et al. | 438/122 |
| 2010/0148354 A1* | 6/2010 | Choi et al. | 257/698 |

FOREIGN PATENT DOCUMENTS

| | | |
|---|---|---|
| JP | 2006-216911 | 8/2006 |
| JP | 2007-123362 | 5/2007 |
| JP | 2009-129975 | 6/2009 |

* cited by examiner

WAFER-LEVEL MOLDED STRUCTURE FOR PACKAGE ASSEMBLY

This application claims the benefit of U.S. Provisional Application No. 61/237,153 filed on Aug. 26, 2009, entitled "Wafer-Level Molded Structure for Package Assembly," which application is hereby incorporated herein by reference.

TECHNICAL FIELD

This disclosure relates generally to integrated circuits, and more particularly to methods of stacking dies, and even more particularly to package assemblies including stacked dies and methods of packaging the same.

BACKGROUND

The semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

An additional limit comes from the significant increase in the number and length of interconnections between devices as the number of devices increases. When the number and length of interconnections increase, both circuit RC delay and power consumption increase.

Three-dimensional (3D) integrated circuits (ICs) are therefore created to resolve the above-discussed limitations. In a typical formation process of 3D ICs, two wafers, each including an integrated circuit, are formed. The wafers are then bonded with the devices aligned. Deep vias are then formed to interconnect devices in the two wafers.

An alternative scheme for forming 3D ICs is bonding dies. Conventionally, to bond two dies together, each of the dies is bonded onto a package substrate, and then the package substrates are further bonded together to form a package. The known methods include package-in-package (PIP) bonding and package-on-package (POP) bonding. These bonding methods, however, suffer from drawbacks. With the usage of package substrates, which are typically larger than the dies, the size of the final package is increased over any of the dies, which may not be desirable. Further, in conventional packaging schemes, a molding compound is used. However, in some high-performance applications, a significant amount of heat is generated in dies, and the molding compounds, which are often not good thermal conductors, reduce the efficiency in heat dissipation.

SUMMARY

In accordance with one aspect of the embodiment, an integrated circuit structure includes a bottom die; a top die bonded to the bottom die with the top die having a size smaller than the bottom die; and a molding compound over the bottom die and the top die. The molding compound contacts edges of the top die. The edges of the bottom die are vertically aligned to respective edges of the molding compound.

Other embodiments are also disclosed.

BRIEF DESCRIPTION OF THE DRAWINGS

For a more complete understanding of the disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the package structure.

A novel package structure and the method of forming the same are presented. The intermediate stages of manufacturing an embodiment are illustrated. The variations of the embodiment are then discussed. Throughout the various views and illustrative embodiments, like reference numbers are used to designate like elements.

Figure 1:
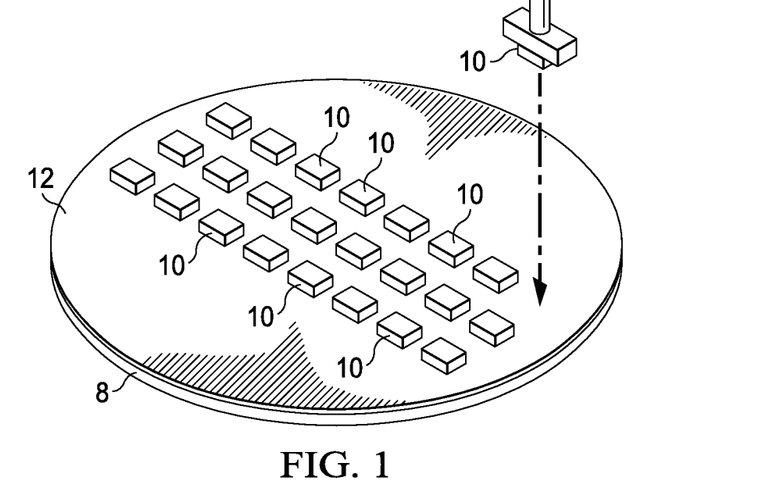
FIGS. 1 through 9 are views of intermediate stages in the manufacturing of a package assembly in accordance with an embodiment.

FIG. 1 illustrates the bonding of top dies 10 onto bottom wafer 12 to form a stacking structure. Before the bonding, bottom wafer 12 may be mounted on carrier 8. Both top dies 10 and bottom wafer 12 may include integrated circuits (not shown), such as complementary metal-oxide-semiconductor (CMOS) transistors, therein. Top dies 10 may be bonded to bottom wafer 12 through flip-chip bonding, although wire bonding may also be used. Top dies 10 may have sizes smaller than that of bottom dies 14 (not shown in FIG. 1, refer to FIG. 6) in bottom wafer 12. An underfill (not shown) may be filled into the space between top dies 10 and bottom wafer 12 to protect the bonds.

Figure 2:
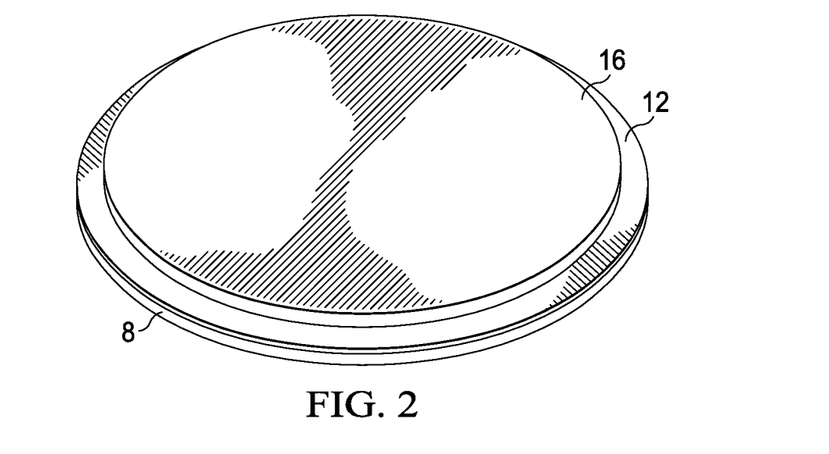

Referring to FIG. 2, a wafer-level molding is performed, and molding compound 16 is molded to cover top dies 10 and bottom wafer 12, for example, using spin coating or printing. Molding compound 16 has a flat top surface. In an embodiment, molding compound 16 provides protection of the stacking structure, and is left in the final structure. Accordingly, molding compound 16 may use commonly used molding compound materials such as resins. In alternative embodiments, molding compound 16 is removed in subsequent process steps, and may use reusable materials such as wax, adhesives (glues), and the like. The reusable materials may be collected after the removal and may be used again. Accordingly, molding compound 16 is also referred to as reusable material 16.

Figure 3:
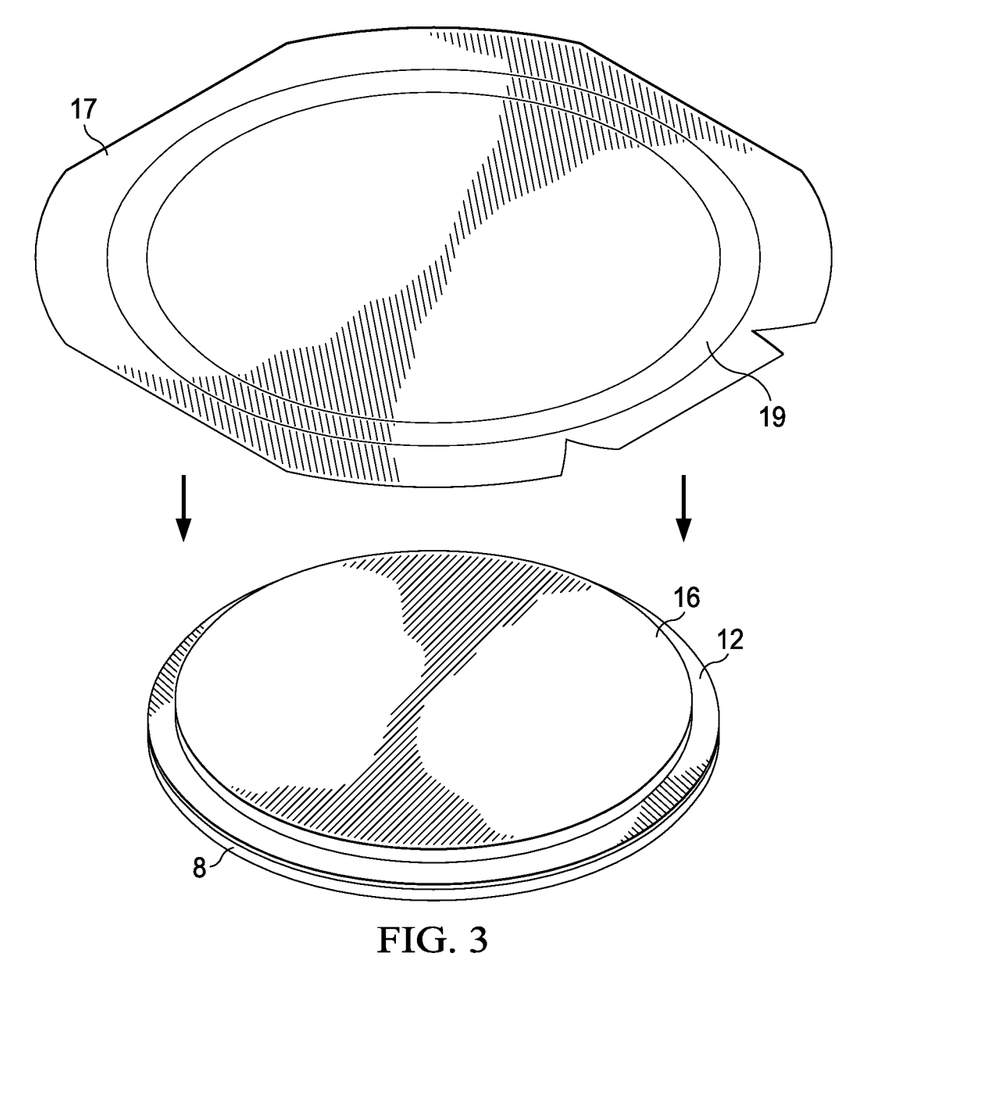
Figure 4:
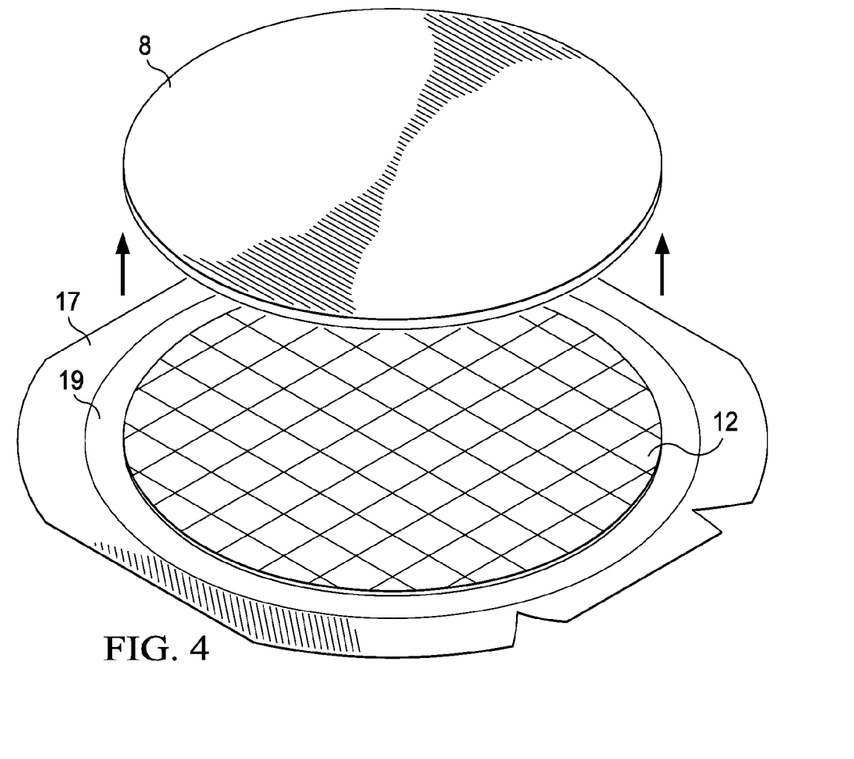

In FIG. 2, reusable material 16 provides a temporary flat surface so that a dicing tape may be mounted thereon. FIG. 3 illustrates dicing tape 19 being mounted onto molding compound 16. Dicing tape 19 may include dicing frame 17 therein. After being mounted, dicing tape 19 is adhered to molding compound 16. Next, as shown in FIG. 4, carrier 8 is de-bonded from bottom wafer 12. In an embodiment, carrier 8 is adhered to bottom wafer 12 through an ultra-violet (UV) glue, and hence may be de-bonded by exposing the UV glue to a UV light. In other embodiments, chemicals may be used to remove the adhesive between carrier 8 and bottom wafer 12.

Figure 5:
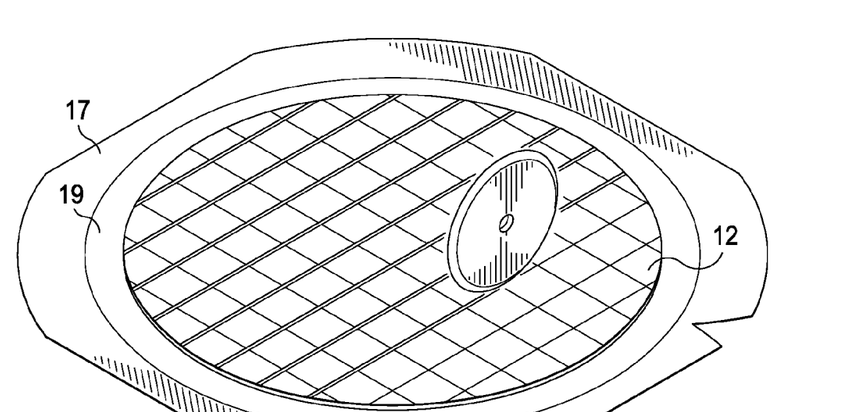
Figure 6:
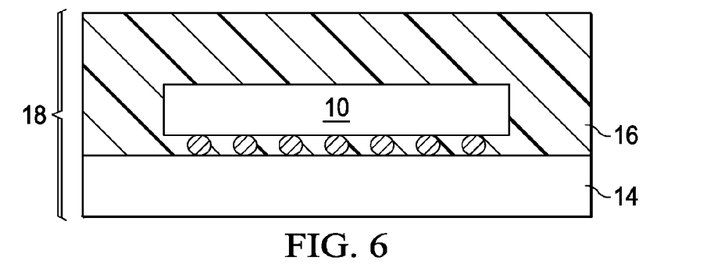

FIG. 5 illustrates the dicing of the stacking structure. A cross-sectional view of a piece of stacked dies (referred to as wafer-level molding unit 18 hereinafter) sawed from the stacking structure is shown in FIG. 6. In the resulting wafer-level molding unit 18, top die 10 is covered by molding compound 16 from the top and sides. However, bottom die 14, which is sawed from bottom wafer 12, shown in FIG. 5, is only covered by molding compound 16 from the top. The edges of molding compound 16 are aligned with edges of bottom die 14. It is observed that since molding compound 16 does not extend onto the edges of bottom die 14, the horizontal size of wafer-level molding unit 18 is equal to the horizontal size of bottom die 14, and is smaller than if molding compound 16 extends to contact the edges of bottom die 14.

Figure 7:
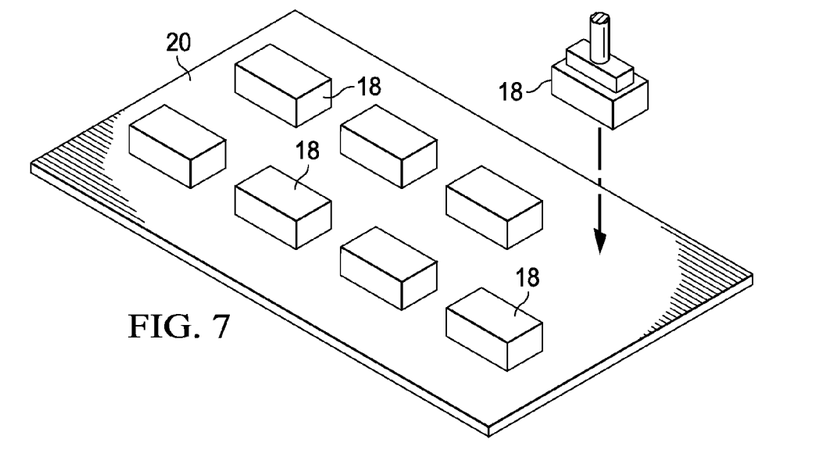

Referring to FIG. 7, wafer-level molding units 18 are bonded onto package substrate 20. The bonding may be flip-chip bonding. In which case, bump balls (not shown) may be pre-mounted onto the bottom side of bottom die 14 shown in FIG. 6. Alternatively, the bump balls may be pre-mounted onto the top surface of package substrate 20 before the bonding is performed. In alternative embodiments, wafer-level molding unit 18 may be bonded onto package substrate 20 through wire bonding.

Figure 8:
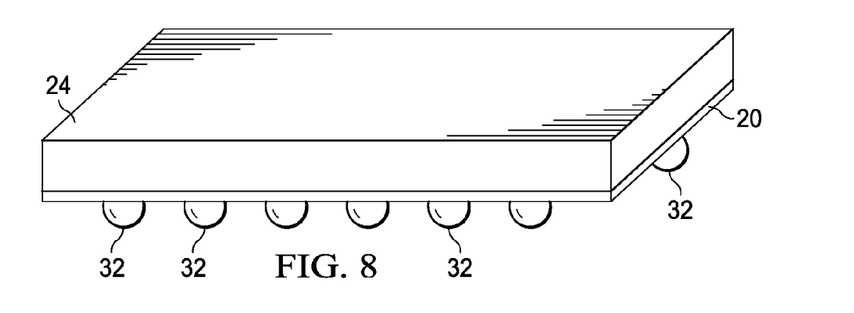
Figure 9:
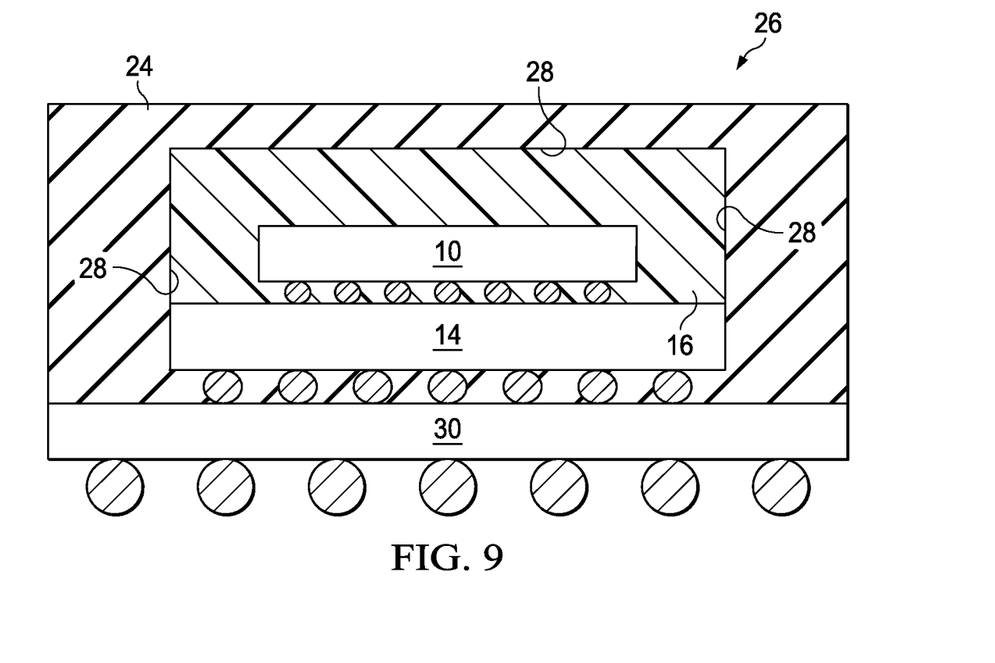

Referring to FIG. 8, a package molding is performed, and molding compound 24 is molded onto wafer-level molding units 18 and package substrate 20. Ball-grid-array (BGA) balls 32, which are solder balls, are also mounted onto package substrate 20. Next, as shown in FIG. 9, a singulation is performed, and package-molded unit 26 is sawed from the structure shown in FIG. 8. The solder balls or wires that are used for bonding top die 10 to bottom die 14, and bottom die 14 to package substrate 30 (a piece sawed from package substrate 20 shown in FIG. 7) are also shown. In an embodiment, molding compounds 16 and 24 comprise different materials, and hence visible interfaces 28 may be observed between molding compounds 16 and 24. In alternative embodiments, molding compounds 16 and 24 are formed of a same material. However, since they are applied at different times, interfaces 28 may still be visible, although they may also sometimes be invisible. Further, package substrate 30 has its edges vertically aligned to edges of molding compound 24.

It is observed that in package-molded unit 26, top die 10 and bottom die 14 do not need to be bonded onto package substrates first before they are bonded together. As a result, fewer process steps and fewer package substrates are needed. The size of the final package is also small.

Figure 10:
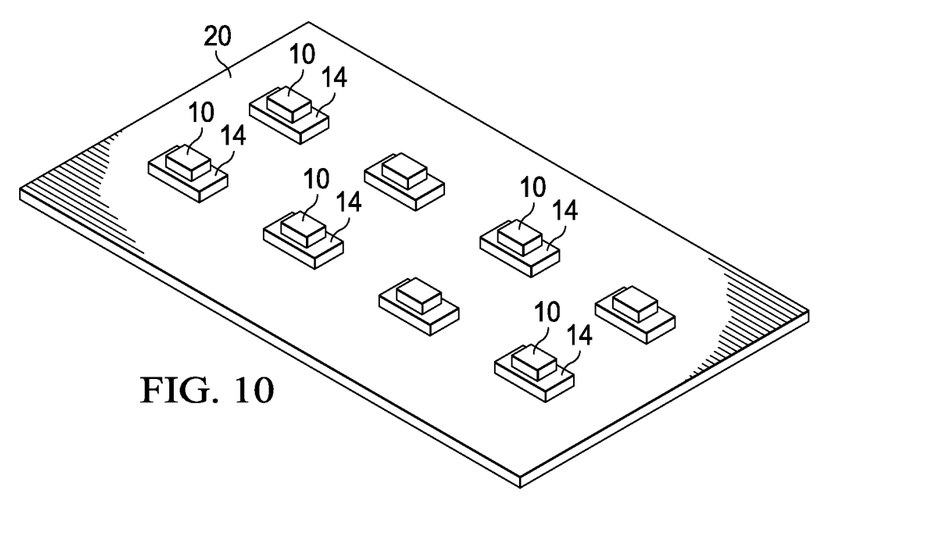
FIGS. 10 through 17 are views of intermediate stages in the manufacturing of additional package assemblies, wherein molding compounds are removed from the additional package assemblies.
Figure 11:
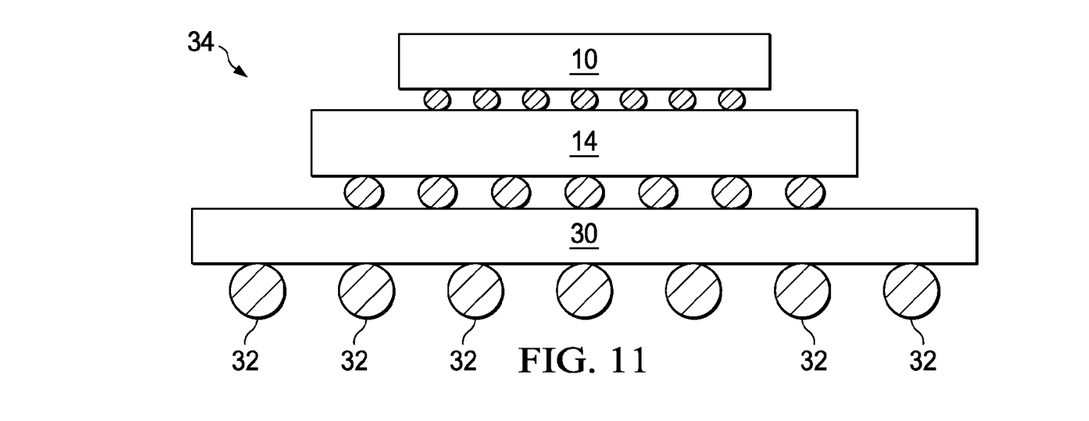
Figure 12:
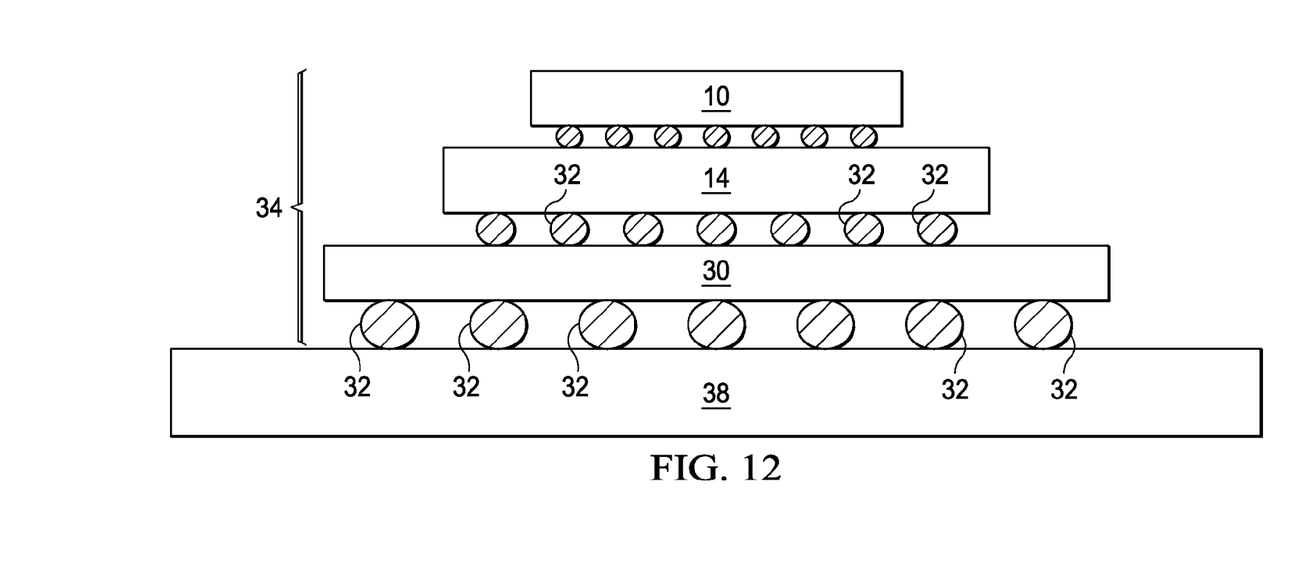

FIGS. 10 through 12 illustrate an alternative embodiment. The initial steps of this embodiment are essentially the same as shown in FIGS. 1 through 7. It is noted that in the step shown in FIG. 2, molding compound 16 is formed of a reusable material. Accordingly, after the step as shown in FIG. 7 is performed, reusable material 16 in wafer-level molding units 18 is removed, for example, using water or other solvents, wherein the desirable solvents depend on the type of the reusable material. The resulting structure is shown in FIG. 10. As a result of the removal of reusable material 16, top dies 10 and bottom dies 14 are exposed to external environment, such as open air. The removed reusable material may be collected and reused. In the reuse of the reusable material, the process steps as shown in FIGS. 1 and 2 are repeated on other top dies and bottom wafers, and the collected reusable material may be molded again to form another molding compound, which is similar to that shown in FIG. 2.

Next, as shown in FIG. 11, a singulation is performed, and packaged die unit 34 is sawed from the structure shown in FIG. 10. BGA balls 32 are also mounted on package substrate 30, which is a piece sawed from package substrate 20 as shown in FIG. 10. In subsequent process steps, packaged die unit 34 may be bonded to other structures such as a printed circuit board (PCB) 38, as shown in FIG. 12. No molding compound is formed to cover top die 10 and/or bottom die 14. Accordingly, top die 10 and bottom die 14 may have a better heat-dissipating ability. For simplicity, the underfill between top die 10 and bottom die 14 and the underfill between bottom die 14 and package substrate 30 are not illustrated.

Figure 13:
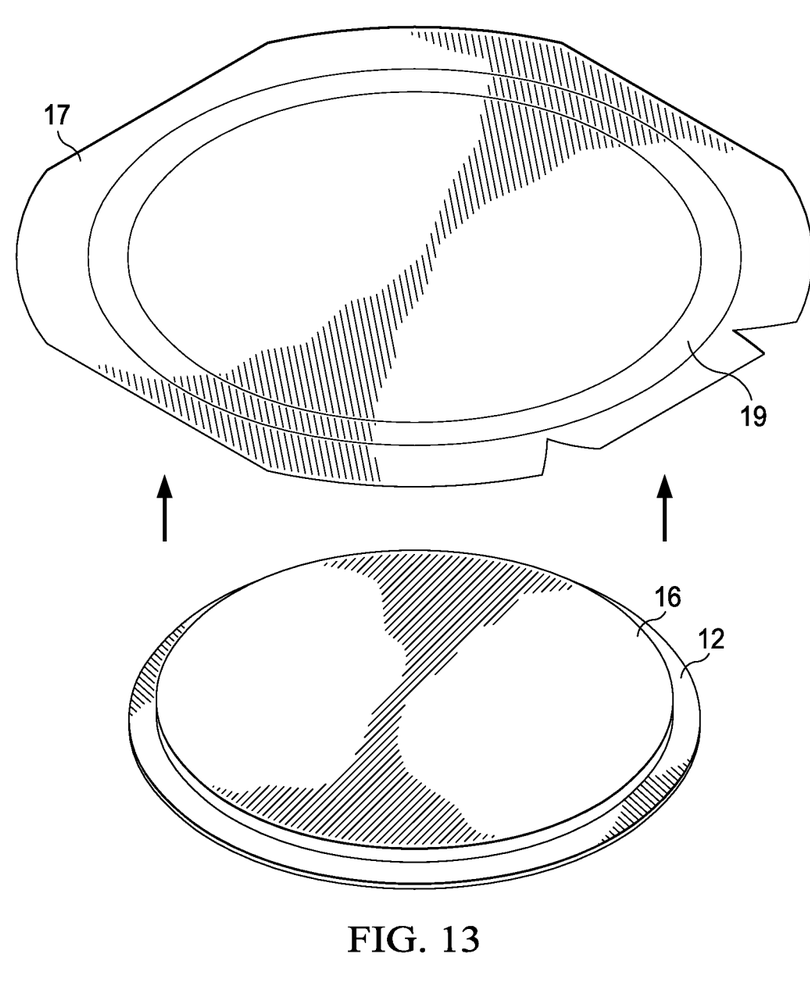
Figure 14:
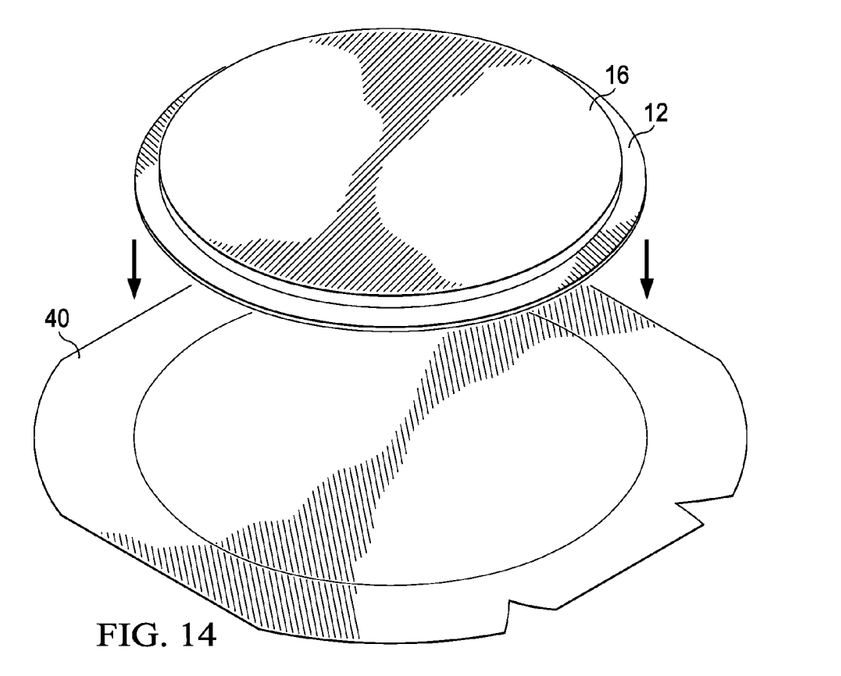
Figure 15:
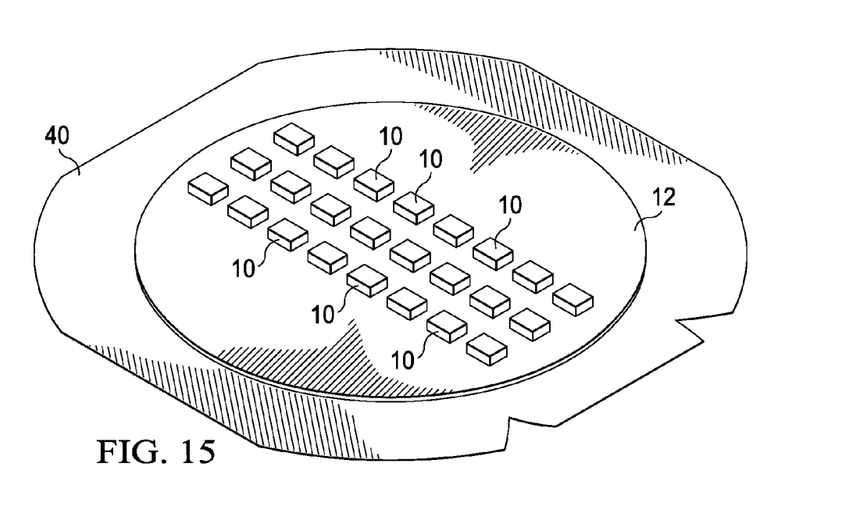

FIGS. 13 through 17 illustrate yet another embodiment. The initial steps of this embodiment are essentially the same as shown in FIGS. 1 through 4, and hence are not repeated herein. Again, in the step shown in FIG. 2, molding compound 16 is formed of a reusable material. After the step as shown in FIG. 4 is performed, the step as shown in FIG. 13 is performed, and dicing tape 19 along with dicing frame 17 is de-mounted from reusable material 16. In FIG. 14, dicing tape 40, which may be the same dicing tape 19 as shown in FIG. 13 or a different one, is attached to bottom wafer 12. Therefore, the steps shown in FIGS. 13 and 14 are equivalent to re-mounting a dicing tape from one side to another of the combined structure including bottom wafer 12 and reusable material 16. As a result, reusable material 16 is exposed, and is removed using water or other solvents, for example. The resulting structure is shown in FIG. 15.

Figure 16:
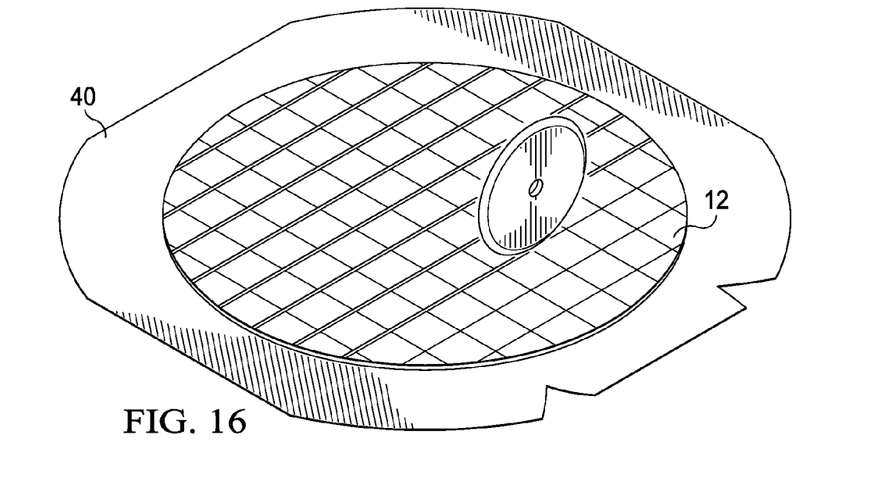
Figure 17:
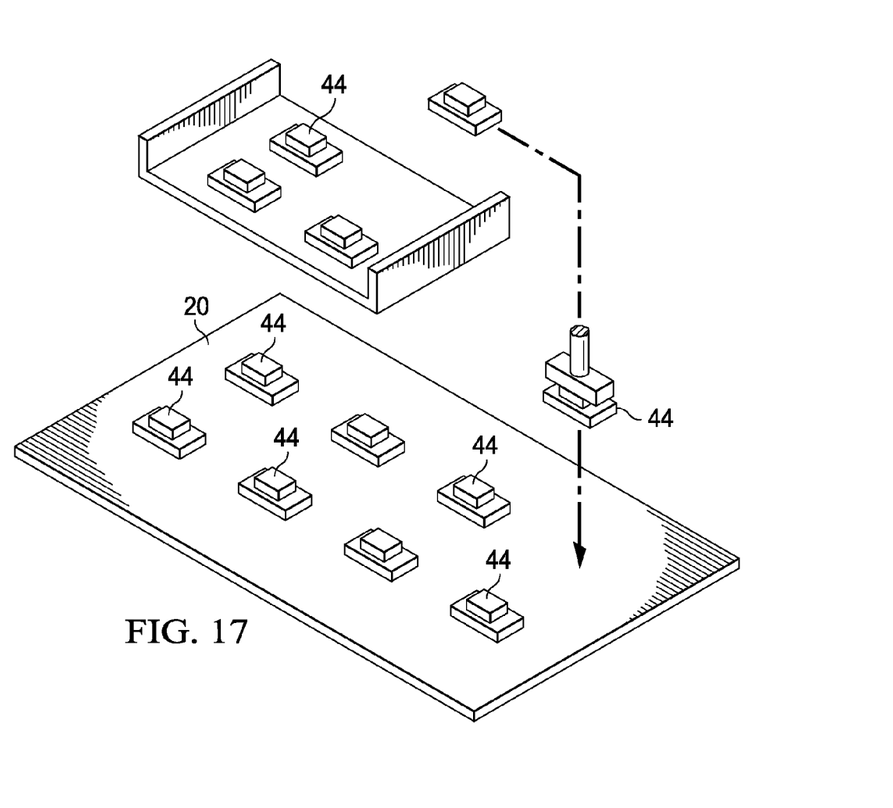

Referring to FIG. 16, the stacking structure, including top dies 10 and bottom wafer 12, are sawed, forming stacking dies 44 as shown in FIG. 17. Next, stacking dies 44 are picked up and bonded onto package substrate 20, followed by underfill (not shown) dispensing and curing, wherein the underfill is dispensed into the space between stacking dies 44 and package substrate 20. The details of the bonding are essentially the same as described for FIG. 7, and hence are not repeated herein. After the step as shown in FIG. 17 is performed, the resulting structure is essentially the same as shown in FIG. 10. Subsequently, the process steps as shown in FIGS. 11 and 12 may be performed.

The embodiments have several advantageous features. By bonding top dies directly to bottom wafers without through package substrates, the package size may be reduced, and the process time and the cost are also reduced. The embodiments provide a multi-die stacking solution, in which a temporary flat surface is formed for the processes such as carrier de-bonding, testing, singulation, and the like. Further, with the use of reusable materials, the manufacturing cost is further reduced. The removal of the molding compound also improves the heat-dissipating ability of package assemblies.

Although the embodiments and their advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
    a bottom die;
    a top die bonded to the bottom die, wherein the top die has a size smaller than the bottom die;
    a molding material over and in between the bottom die and the top die, wherein the molding material extends to and contacts edges of the top die and extends along and contacts an entirety of a top surface of the top die, and wherein edges of the bottom die are vertically aligned with respective edges of the molding material; and
    a package substrate underlying and bonded to the bottom die using solder balls.

2. The integrated circuit structure of claim 1 further comprising an additional molding compound over the package substrate and contacting the bottom die, wherein the molding material and the additional molding compound have a visible interface aligned to an edge of the bottom die.

3. The integrated circuit structure of claim 2, wherein the molding material and the additional molding compound are formed of a same material.

4. The integrated circuit structure of claim 2, wherein the molding material and the additional molding compound are formed of different materials.

5. The integrated circuit structure of claim 2, wherein the additional molding compound further comprises a portion directly over and contacting the molding material.

6. The integrated circuit structure of claim 1, wherein the top die and the bottom die are bonded through flip-chip bonding.

7. The integrated circuit structure of claim 1, wherein the molding material is soluble in a solvent.

8. The integrated circuit structure of claim 7, wherein the solvent comprises water.

* * * * *